(12) United States Patent
Hung et al.

(10) Patent No.: US 10,642,430 B2
(45) Date of Patent: May 5, 2020

(54) DIFFERENTIAL CIRCUIT

(71) Applicant: Shenzhen Goodix Technology Co., Ltd., Shenzhen, Guangdong (CN)

(72) Inventors: Tzu-Li Hung, Taipei (TW); Fu-Chiang Yang, Taipei (TW); Ya-Nan Wen, Taipei (TW)

(73) Assignee: Shenzhen Goodix Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 16/116,902

(22) Filed: Aug. 29, 2018

(65) Prior Publication Data
US 2018/0373363 A1 Dec. 27, 2018

Related U.S. Application Data

(63) Continuation of application No. PCT/CN2017/072526, filed on Jan. 24, 2017.

(51) Int. Cl.
*G06F 3/044* (2006.01)
*G06F 3/045* (2006.01)
*G06F 3/041* (2006.01)
*H03F 3/45* (2006.01)

(52) U.S. Cl.
CPC .............. *G06F 3/044* (2013.01); *G06F 3/045* (2013.01); *G06F 3/0416* (2013.01); *G06F 3/0418* (2013.01); *H03F 3/45928* (2013.01)

(58) Field of Classification Search
USPC .................................................. 330/252–261
See application file for complete search history.

(56) References Cited

U.S. PATENT DOCUMENTS

| | | | |
|---|---|---|---|
| 9,134,824 B2 * | 9/2015 | Kang .................. | G06F 3/03547 |
| 10,175,839 B2 * | 1/2019 | Srivastava ............ | G06F 3/0412 |
| 2011/0216039 A1 * | 9/2011 | Chen ..................... | G06F 3/0412 |
| | | | 345/174 |
| 2015/0185913 A1 | 7/2015 | Han | |
| 2016/0291765 A1 | 10/2016 | Shen | |

FOREIGN PATENT DOCUMENTS

| | | |
|---|---|---|
| CN | 101923415 A | 12/2010 |
| CN | 103135840 A | 6/2013 |
| CN | 105339876 A | 2/2016 |
| EP | 2 369 450 A1 | 9/2011 |
| EP | 2 463 757 A1 | 6/2012 |

* cited by examiner

*Primary Examiner* — Hieu P Nguyen
(74) *Attorney, Agent, or Firm* — Winston Hsu

(57) ABSTRACT

A differential circuit is provided. The differential circuit comprises a plurality of electrodes comprising at least a middle electrode, wherein the middle electrode is directly adjacent to a first electrode and a second electrode of the plurality of electrodes; a plurality of amplifiers, coupled to the plurality of electrodes; and at least a buffer, coupled between the middle electrode and at least one amplifier of the plurality of amplifiers.

10 Claims, 5 Drawing Sheets

DIFFERENTIAL CIRCUIT

CROSS REFERENCE TO RELATED APPLICATIONS

The present application is a continuation of international application No. PCT/CN2017/072526, filed on Jan. 24, 2017, which is incorporated hereby incorporated by reference in its entirety.

FIELD OF THE INVENTION

The present application relates to a differential circuit, and more particularly, to a differential circuit capable of effectively canceling the common mode noise.

BACKGROUND

As the technology evolves, the operating interfaces of various electronic products gradually become more user-friendly in recent years. For example, through the touch panel, the user can directly operate on the screen with a finger or a stylus to input a message/text/pattern, which spares the trouble of using an input device such as a keyboard or a button. In fact, the touch panel usually includes a sensing panel and a monitor disposed behind the sensing panel. The electronic device determines the meaning of the touch events according to the location of the touch made by the user on the sensing panel and the content displayed by the monitor, and performs the corresponding operations.

Specifically, the receiving electrodes of the touch panel may be affected by the common mode noise, where the common mode noise may gave more or less affection on all of the receiving electrodes of the touch panel. When the SNR (Signal-to-Noise Ratio) is small, the touch signal may be overwhelmed by the common mode noise, such that the touch location may not be correctly determined. Therefore, how to eliminate the common mode noise of the receiving electrode of the touch panel is a significant objective in the field.

SUMMARY

It is therefore a primary objective of the present application to provide a differential circuit capable of effectively canceling the common mode noise, to improve over disadvantages of the prior art.

In order to solve the problem stated in the above, the present application provides a differential circuit, a plurality of electrodes, including at least a middle electrode, wherein the at least a middle electrode is directly adjacent to a first electrode and a second electrode of the plurality of electrodes; a plurality of amplifiers, coupled to the plurality of electrodes; and at least a buffer, coupled between the middle electrode and at least one amplifier of the plurality of amplifiers.

Preferably, the middle electrode is coupled to a first amplifier and a second amplifier of the plurality of amplifiers.

Preferably, the first amplifier includes a first input terminal and a second input terminal, the second amplifier includes a third input terminal and a fourth input terminal, the first input terminal is coupled to the first electrode, the fourth input terminal is coupled to the second electrode, the middle electrode is coupled to the second input terminal and the third input terminal.

Preferably, a buffer within the at least a buffer is coupled between the middle electrode and the second input terminal of the first amplifier.

Preferably, a buffer within the at least a buffer is coupled between the middle electrode and the third input terminal of the second amplifier.

Preferably, the differential circuit further includes a plurality of transconductance units, coupled between a plurality of input terminals of the plurality of amplifiers and the plurality of electrodes.

Preferably, a transconductance unit within the plurality of transconductance units is a resistor.

Preferably, the differential circuit further includes a plurality of impedance units, coupled between a plurality of input terminals and a plurality of output terminals of the plurality of amplifiers.

Preferably, an impedance unit within the plurality of impedance units includes a resistor and a capacitor.

Preferably, an amplifier of the plurality of amplifiers is a full differential operation amplifier.

These and other objectives of the present invention will no doubt become obvious to those of ordinary skill in the art after reading the following detailed description of the preferred embodiment that is illustrated in the various figures and drawings.

DETAILED DESCRIPTION

In order to make the objects, technical solutions and advantages of the present application become more apparent, the following relies on the accompanying drawings and embodiments to describe the present application in further detail. It should be understood that the specific embodiments described herein are only for explaining the present application and are not intended to limit the present application.

Figure 1:
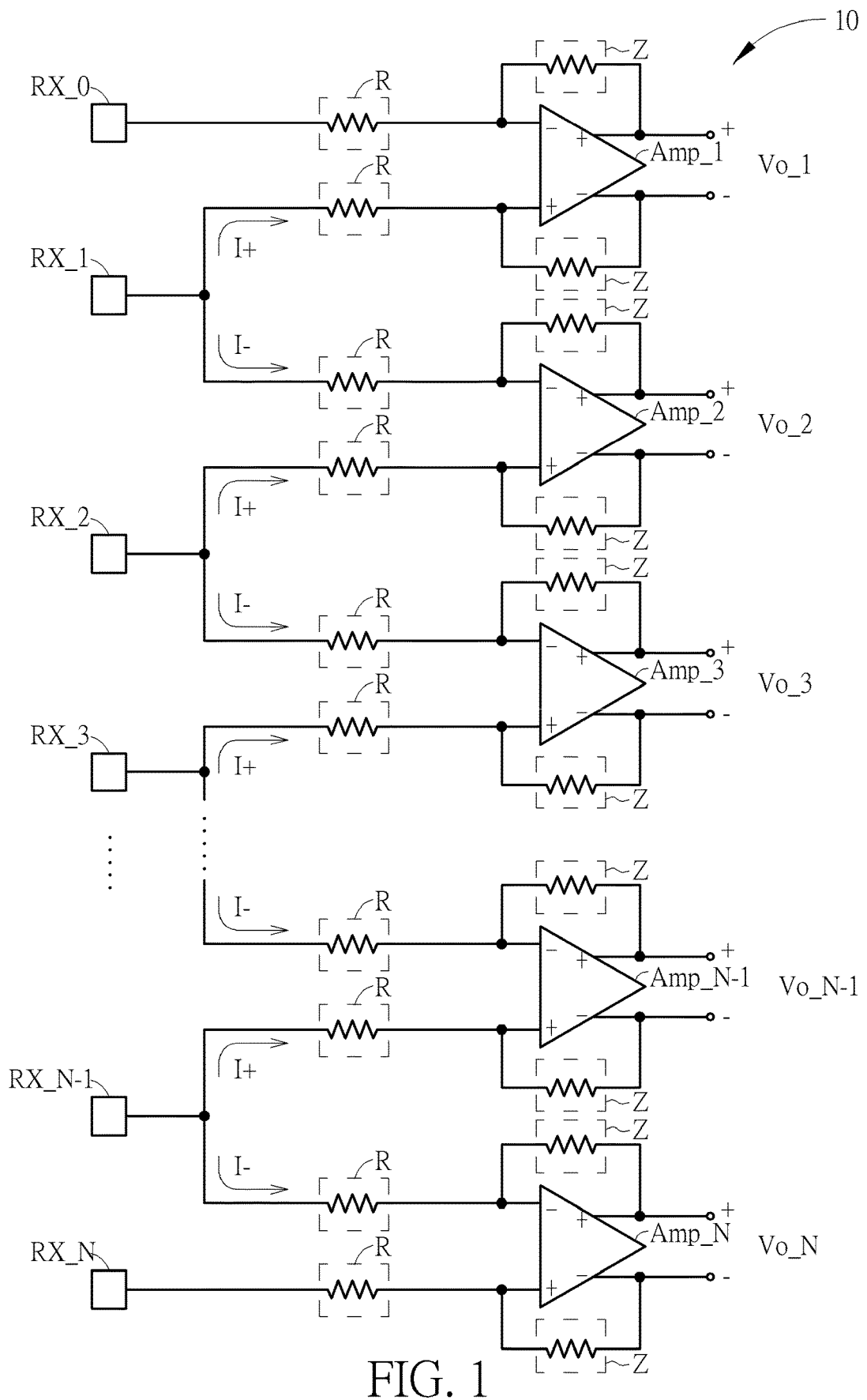
FIG. 1 is a schematic diagram of a differential circuit.

Please refer to FIG. 1. FIG. 1 is a schematic diagram of a differential circuit 10. The differential circuit 10 may be applied to a touch panel, which includes electrodes RX_0-RX_N and amplifiers Amp_1-Amp_N. The amplifiers Amp_1-Amp_N may be full differential operation amplifiers. The electrodes RX_0-RX_N may be connected to the receiving electrode for sensing touch of the touch panel. A touch determining module (not shown in FIG. 1) of the touch panel may determine capacitances corresponding to the electrodes RX_0-RX_N according to currents or voltages of the electrodes RX_0-RX_N, to further determine coordinates/locations of touch events. In general, the electrodes RX_0-RX_N would be affected by a common mode noise, and an accuracy of determining touch location may be reduced. The common mode noise may be noise from a display panel (not shown in FIG. 1). In order to eliminate the affection of the common mode noise on the determination of capacitance of the electrodes RX_0-RX_N, the amplifiers Amp_1-Amp_N, coupled to the electrodes RX_0-RX_N, may be configured to obtain differential signals Va_1-Va_N between the electrodes RX_0-RX_N. Specifically, a negative input terminal (denoted as "−") of the amplifier Amp_n is coupled to the electrode RX_n−1, a positive input terminal (denoted as "+") of the amplifier Amp_n is coupled to the electrode RX_n, and Vo_n represents the differential signal between the electrode RX_n−1 and the electrode RX_n, where n is an integer ranging from 1 to N.

In the differential circuit 10, the electrodes RX_0 and RX_N are regarded as boundary electrodes (of the electrodes RX_0-RX_N), and the electrodes RX_1-RX_N−1 are regarded as the middle electrodes (between the electrode RX_0 and the electrode RX_N). The electrodes RX_0 and RX_N being the boundary electrodes means that the electrode RX_0 and the electrode RX_N are directly adjacent to only one electrode, and the electrodes RX_1-RX_N−1 being the middle electrodes means that each electrode of the electrodes RX_1-RX_N−1 is directly adjacent to two electrodes. Moreover, an electrode RX_a and an electrode RX_b of the electrodes RX_0-RX_N being directly adjacent to each other means that the electrode RX_a is adjacent to the electrode RX_b and no other electrode exists between the electrodes RX_a and RX_b. Take the differential circuit 10 as an example, the electrode RX_0 is adjacent to the electrode RX_1, and no other electrode exists between the electrode RX_0 and the electrode RX_1. That is, the electrode RX_0 is directly adjacent to the electrode RX_1. The electrode RX_N is adjacent to the electrode RX_N−1, and no other electrode exists between the electrode RX_N and the electrode RX_N−1. That is, the electrode RX_N is directly adjacent to the electrode RX_N−1. Notably, the electrode RX_0 is only directly adjacent to the electrode RX_1, and the electrode RX_N is only directly adjacent to the electrode RX_N−1. Thus, the electrodes RX_0 and RX_N are regarded as boundary electrodes. In another perspective, any electrode RX_m within the electrodes RX_1-RX_N−1 is directly adjacent to the electrode RX_m−1 and the electrode RX_m+1 (where m is an integer ranging from 1 to N−1). That is, the electrode RX_m is directly adjacent to the electrode RX_m−1 and the electrode RX_m+1. Thus, the electrodes RX_1-RX_N−1 are the middle electrodes.

Nevertheless, since each middle electrode among the middle electrodes RX_1-RX_N−1 is simultaneously coupled to two amplifiers, current diversion effect occurs, which would reduce the accuracy of determining the touch location. Specifically, take the middle electrode RX_m as an example (wherein m is an integer ranging from 1 to N−1), the middle electrode RX_m is simultaneously coupled to the positive input terminal of the amplifier Amp_m and the negative input terminal of the amplifier Amp_m+1. In such a situation, the electric current flowing through the middle electrode RX_m would be diverted as an electric current $I_+$ and an electric current $I_-$, where the electric current $I_+$ flows from the middle electrode RX_m to the positive input terminal of the amplifier Amp_m, and the electric current $I_-$ flows from the middle electrode RX_m to the negative input terminal of the amplifier Amp_m+1. Nevertheless, the current diversion effect may change the operating point of the amplifier Amp_m (or the amplifier Amp_m+1), such that the voltage at the positive input terminal of the amplifier Amp_m (or the negative input terminal of the amplifier Amp_m+1) may be different from the voltage at the middle electrode RX_m, such that the differential signal Vo_m is not able to precisely represent the voltage difference between the electrode RX_m−1 and the electrode RX_m (or the differential signal Vo_m+1 is not able to precisely represent the voltage difference between the electrode RX_m and the electrode RX_m+1), and the accuracy of determining the touch location is reduced.

Therefore, the differential circuit of the present application utilizes the buffer(s) to block the electric current flowing from the middle electrode to one of the amplifiers, to solve the problem of low accuracy of determining the touch location which is caused by the diversion of the electric current flowing through the middle electrode to the input terminals of the two amplifiers. In other words, the present application may insert a buffer with high input impedance between the middle electrode RX_m and the amplifier Amp_m (or the amplifier Amp_m+1), to block the electric current flowing from the middle electrode RX_m to the amplifier Amp_m (or the amplifier Amp_m+1), so as to enhance the accuracy of determining the touch location.

Figure 2:
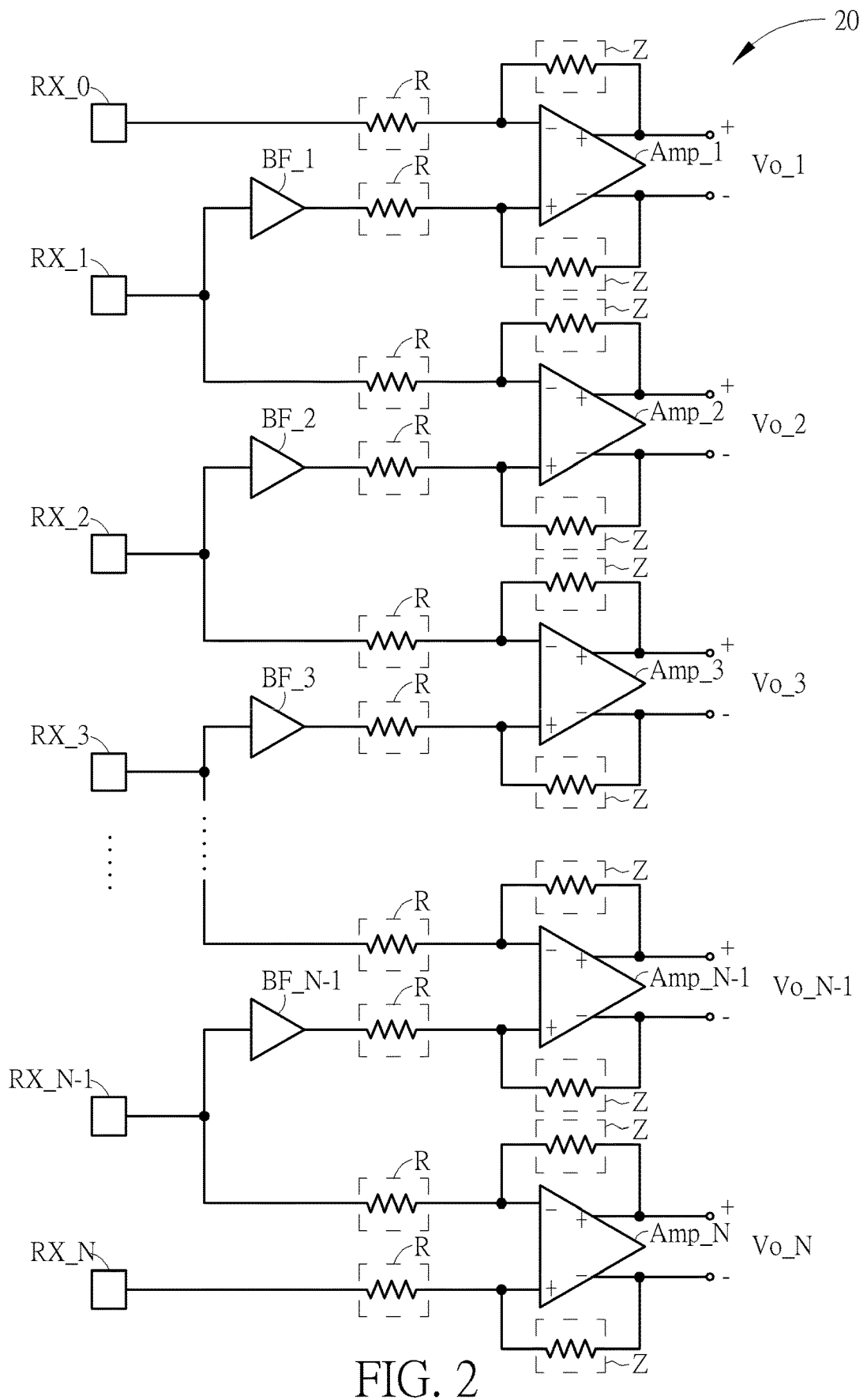
FIG. 2 is a schematic diagram of a differential circuit according to an embodiment of the present application.

For example, please refer to FIG. 2. FIG. 2 is a schematic diagram of a differential circuit 20 according to an embodiment of the present application. The differential circuit 20 is similar to the differential circuit 10, and thus, the same components are denoted by the same notations. Different from the differential circuit 10, the differential circuit 20 includes buffers BF_1-BF_N−1. The buffers BF_1-BF_N−1 are corresponding to the middle electrodes RX_1-RX_N−1, and coupled between the middle electrodes RX_1-RX_N−1 and the amplifiers Amp_1-Amp_N−1. In other words, the buffer BF_m is corresponding to the middle electrode RX_m, and coupled between the middle electrode RX_m and the positive input terminal of the amplifier Amp_m. For example, the buffer BF_1 is corresponding to the middle electrode RX_1 and coupled between the middle electrode RX_1 and the positive input terminal of the amplifier Amp_1. The buffer BF_2 is corresponding to the middle electrode RX_2 and coupled between the middle electrode RX_2 and the positive input terminal of the amplifier Amp_2, and so on and so forth. The buffer BF_N−1 is corresponding to the middle electrode RX_N−1 and coupled between the middle electrode RX_N−1 and the positive input terminal of the amplifier Amp_N−1.

In such a situation, since the buffer BF_m coupled between the middle electrode RX_m and the positive input terminal of the amplifier Amp_m has high input impedance, which may be configured to block the electric current $I_+$ flowing from the middle electrode RX_m flowing to the positive input terminal of the amplifier Amp_m, such that the voltage of the positive input terminal of the amplifier Amp_m would be equal to the voltage of the middle electrode RX_m, and the differential signal Vo_m is able to precisely represent the voltage difference between the electrode RX_m−1 and the electrode RX_m, and the accuracy of determining the touch location is further enhanced.

In addition, the differential circuit 20 further includes a plurality of transconductances units R. The plurality of transconductance units R are coupled between the plurality of input terminals of the amplifiers Amp_1-Amp_N and the electrodes RX_0-RX_N. In an embodiment, the transconductance unit R may be a resistor. The differential circuit 20 further includes a plurality of impedance units Z, the impedance unit Z may be coupled between the negative input terminal and a positive output terminal (denoted as "+") of the amplifier Amp_n, or may be coupled between the positive input terminal and a negative output terminal (denoted as "−") of the amplifier Amp_n. In an embodiment, the impedance unit Z may be composed of a resistor.

Figure 3:
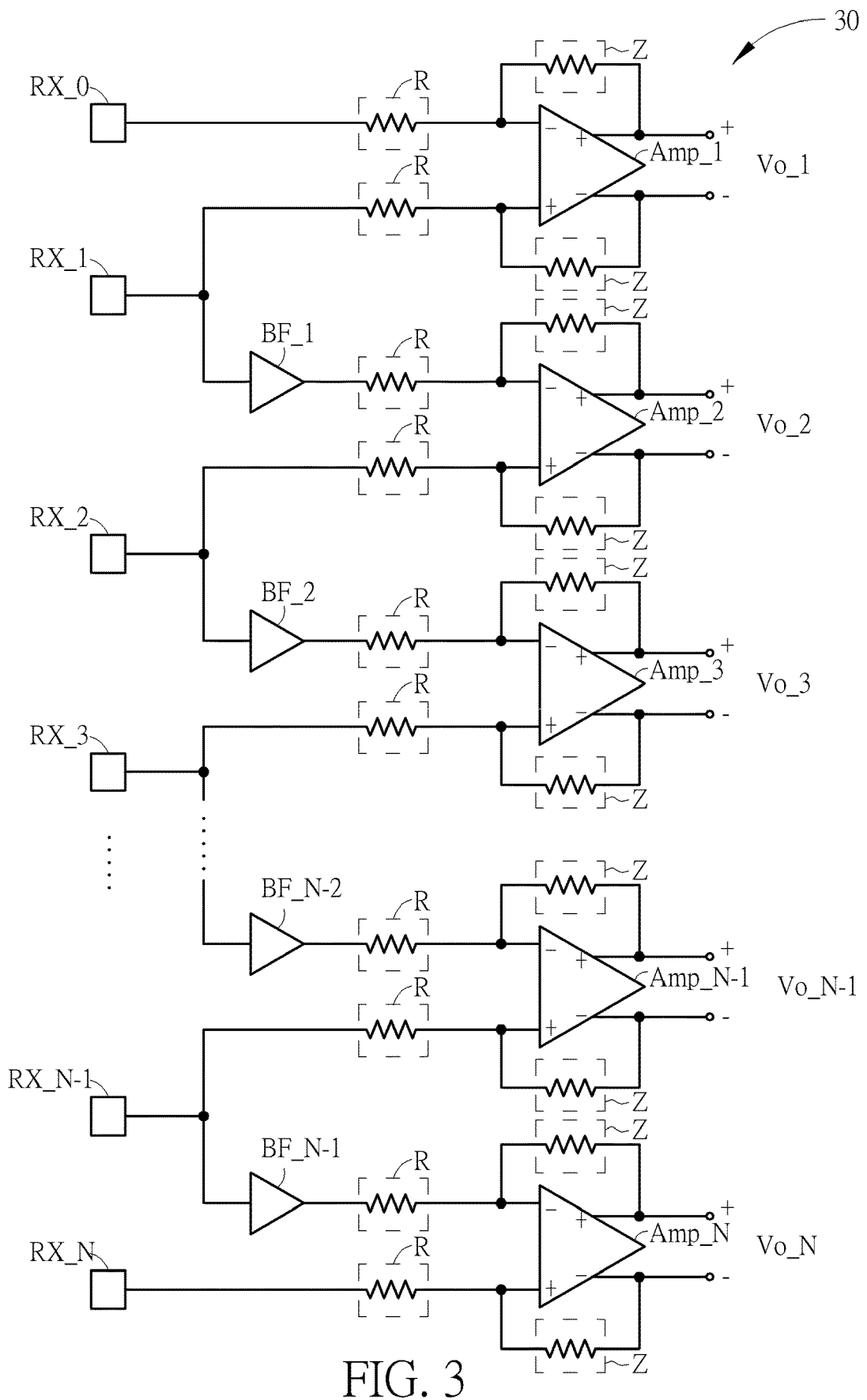
FIG. 3 is a schematic diagram of a differential circuit according to an embodiment of the present application.

Notably, the embodiments stated in the above are utilized for illustrating the concept of the present application. Those skilled in the art may make modifications and alterations accordingly, and not limited herein. For example, please refer to FIG. 3. FIG. 3 is a schematic diagram of a differential circuit 30 according to an embodiment of the present application. The differential circuit 30 is similar to the differential circuit 20, and thus, the same components are denoted by the same notations. Different from the differential circuit 20, in the differential circuit 30, the buffers BF_1-BF_N–1 are corresponding to the middle electrodes RX_1-RX_N–1, and coupled between the middle electrodes RX_1-RX_N–1 and the amplifiers Amp_2-Amp_N. In other words, the buffer BF_m is corresponding to the middle electrode RX_m, and coupled between the middle electrode RX_m and the negative input terminal of the amplifier Amp_m+1, to block the electric current I_ flowing from the middle electrode RX_m to the negative input terminal the amplifiers Amp_m+1, which is within the scope of the present application.

Figure 4:
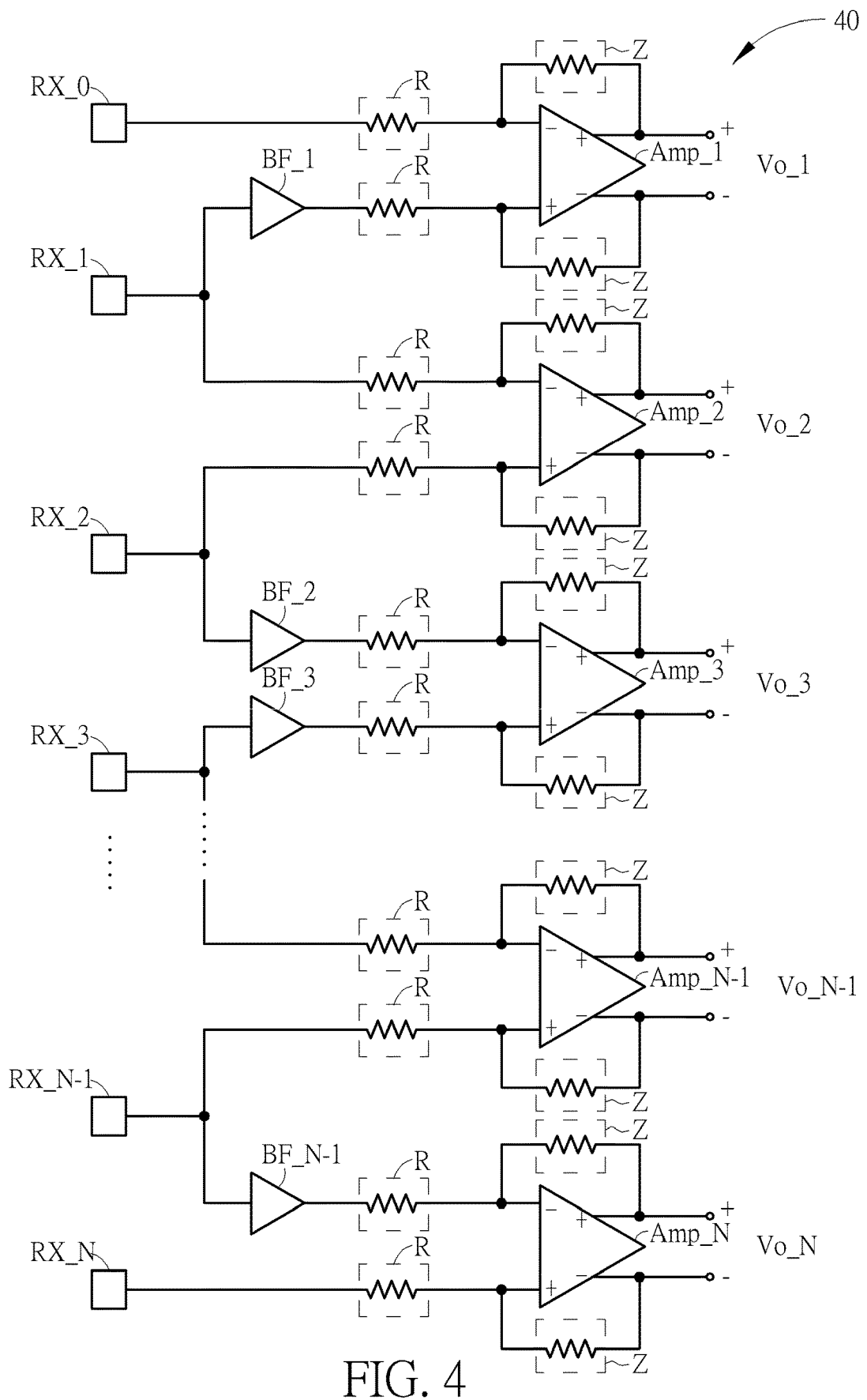
FIG. 4 is a schematic diagram of a differential circuit according to an embodiment of the present application.

In addition, in the differential circuit 20, each buffer BF_m within the buffers BF_1-BF_N–1 is coupled between the middle electrode RX_m and the positive input terminal of the amplifier Amp_m. In the differential circuit 30, each buffer BF_m within the buffers BF_1-BF_N–1 is coupled between the middle electrode RX_m and the negative input terminal of the amplifier Amp_m+1. Nevertheless, the differential circuit the present application is not limited thereto. For example, please refer to FIG. 4. FIG. 4 is a schematic diagram of a differential circuit 40 according to an embodiment of the present application. The differential circuit 40 is similar to the differential circuits 20 and 30, and thus, the same components are denoted by the same notations. Different from the differential circuits 20 and 30, in the differential circuit 40, a part of buffer (s) BF_m1 within the buffers BF_1-BF_N–1 is coupled between the middle electrode RX_m1 and the positive input terminal of the amplifier Amp_m1, and another part of buffer(s) BF_m2 within the buffers BF_1-BF_N–1 is coupled between the middle electrode RX_m2 and the negative input terminal of the amplifier Amp_m2+1 (where m1 are m2 integers ranging from 1 to N–1). As long as a terminal of the each buffer BF_m within the buffers BF_1-BF_N–1 is coupled to the middle electrode RX_m, and another terminal is coupled to the positive input terminal of the amplifier Amp_m or the negative input terminal of the amplifier Amp_m+1, the requirements of the present application is satisfied, which is within the scope of the present application.

Figure 5:
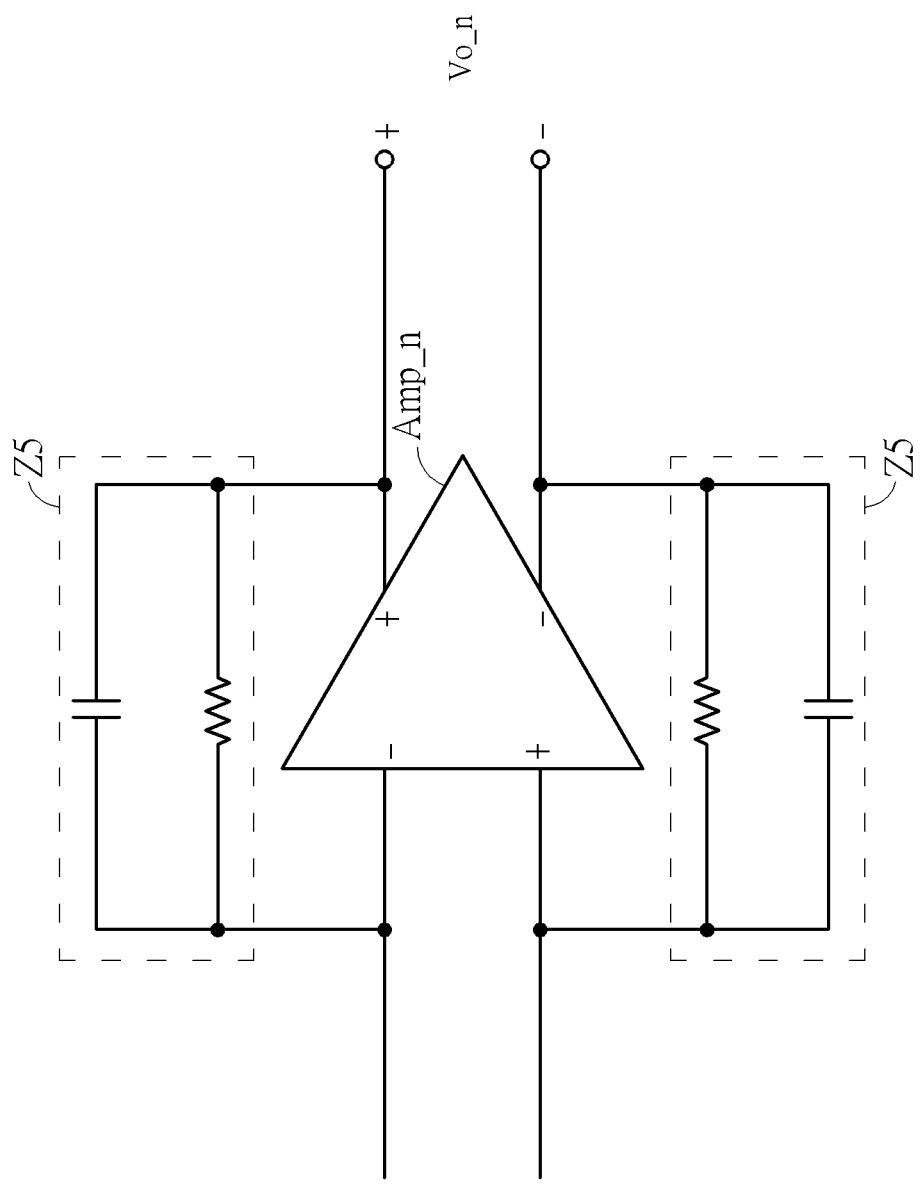
FIG. 5 is a schematic diagram of an amplifier and a plurality of impedance units according to an embodiment of the present application.

In addition, the impedance unit Z is not limited to being composed of resistor(s), the impedance unit Z may include a capacitor. For example, please refer to FIG. 5, FIG. 5 is a schematic diagram of the amplifier Amp_n and a plurality of impedance units Z5 according to an embodiment of the present application. As shown in FIG. 5, the impedance unit Z5 may include a resistor and a capacitor. The impedance unit Z5 may be coupled between the negative input terminal and the positive output terminal of the amplifier Amp_n, or coupled between the positive input terminal and the negative output terminal of the amplifier Amp_n, which is within the scope of the present application.

In summary, the present application utilizes the buffer(s) with high input impedance, to block the electric current flowing from the middle electrodes to the amplifiers, such that the differential signal may precisely represent the voltage difference between two electrodes which are directly adjacent to each other. Compared to the prior art, the present application may enhance the accuracy of determining the touch location.

The foregoing is only embodiments of the present application, which is not intended to limit the present application. Any modification following the spirit and principle of the present application, equivalent substitutions, improvements should be included within the scope of the present application.

What is claimed is:

1. A differential circuit, characterized in that, the differential circuit comprises:
    a plurality of electrodes, comprising at least a middle electrode, wherein a middle electrode among the at least a middle electrode is directly adjacent to a first electrode and a second electrode of the plurality of electrodes;
    a plurality of amplifiers, coupled to the plurality of electrodes; and
    at least a buffer, coupled between the middle electrode and at least one amplifier of the plurality of amplifiers;
    wherein the middle electrode is coupled to a first amplifier and a second amplifier of the plurality of amplifiers;
    wherein the middle electrode is only coupled to one buffer among the at least a buffer;
    wherein the buffer is either coupled between the middle electrode and the first amplifier, or coupled between the middle electrode and the second amplifier.

2. The differential circuit of claim 1, characterized in that, the first amplifier comprises a first input terminal and a second input terminal, the second amplifier comprises a third input terminal and a fourth input terminal, the first input terminal is coupled to the first electrode, the fourth input terminal is coupled to the second electrode, the middle electrode is coupled to the second input terminal and the third input terminal.

3. The differential circuit of claim 2, characterized in that, the buffer is coupled between the middle electrode and the second input terminal of the first amplifier.

4. The differential circuit of claim 2, characterized in that, the buffer is coupled between the middle electrode and the third input terminal of the second amplifier.

5. The differential circuit of claim 1, characterized in that, further comprising:
    a plurality of transconductance units, coupled between a plurality of input terminals of the plurality of amplifiers and the plurality of electrodes.

6. The differential circuit of claim 5, characterized in that, the transconductance unit comprises a resistor.

7. The differential circuit of claim 1, characterized in that, further comprising:
    a transconductance unit, connected between the buffer and the at least one amplifier of the plurality of amplifiers.

8. The differential circuit of claim 1, characterized in that, further comprising:
    a plurality of impedance units, coupled between a plurality of input terminals and a plurality of output terminals of the plurality of amplifiers.

9. The differential circuit of claim 8, characterized in that, the impedance unit comprises a resistor and a capacitor.

10. The differential circuit of claim 1, characterized in that, the amplifier comprises a full differential operation amplifier.

* * * * *